(12) United States Patent
Ramm

(10) Patent No.: US 10,323,320 B2
(45) Date of Patent: *Jun. 18, 2019

(54) METHOD FOR PRODUCING METAL OXIDE LAYERS OF PREDETERMINED STRUCTURE THROUGH ARC VAPORIZATION

(75) Inventor: Jürgen Ramm, Maienfeld (CH)

(73) Assignee: OERLIKON SURFACE SOLUTIONS AG, PFÄFFIKON, Pfäffkon SZ (CH)

( * ) Notice: Subject to any disclaimer, the term of this patent is extended or adjusted under 35 U.S.C. 154(b) by 900 days.

This patent is subject to a terminal disclaimer.

(21) Appl. No.: 12/428,699

(22) Filed: Apr. 23, 2009

(65) Prior Publication Data

US 2009/0269615 A1    Oct. 29, 2009

Related U.S. Application Data

(60) Provisional application No. 61/047,591, filed on Apr. 24, 2008.

(30) Foreign Application Priority Data

Sep. 19, 2008    (EP) .................................... 08016572

(51) Int. Cl.
| | |
|---|---|
| *C23C 14/34* | (2006.01) |
| *C22C 1/04* | (2006.01) |
| *C23C 14/00* | (2006.01) |
| *C23C 14/08* | (2006.01) |
| *C23C 14/32* | (2006.01) |

(52) U.S. Cl.
CPC ........ *C23C 14/3414* (2013.01); *C22C 1/0416* (2013.01); *C23C 14/0036* (2013.01); *C23C 14/08* (2013.01); *C23C 14/081* (2013.01); *C23C 14/083* (2013.01); *C23C 14/325* (2013.01); *B22F 2998/00* (2013.01); *Y10T 428/12028* (2015.01)

(58) Field of Classification Search
CPC ..... C22C 1/0416; C23C 14/08; C23C 14/081; C23C 14/083; C23C 14/325
USPC ...................................... 204/192.38
See application file for complete search history.

(56) References Cited

U.S. PATENT DOCUMENTS

| | | | |
|---|---|---|---|
| 5,518,597 A | 5/1996 | Storer et al. | |
| 6,602,390 B1 * | 8/2003 | Brandle et al. | .......... 204/298.41 |
| 6,702,931 B2 | 3/2004 | Brandle | |

(Continued)

FOREIGN PATENT DOCUMENTS

| | | |
|---|---|---|
| CH | 688863 A5 | 4/1998 |
| DE | 19522331 A1 | 1/1996 |

(Continued)

OTHER PUBLICATIONS

H. Okamoto, Aluminum—Chromium, 2008, Journal of Phase Equilibrium and Diffusion, 29, 112-113.*

(Continued)

*Primary Examiner* — Rodney G McDonald
(74) *Attorney, Agent, or Firm* — Pearne & Gordon LLP

(57) ABSTRACT

The invention relates to a method for producing layers consisting of ternary and higher oxides of metallic and semi-metallic components, wherein the formation temperature of these oxides can be determined essentially through the composition of the binary (or higher) alloy targets (based on the phase diagram).

11 Claims, 5 Drawing Sheets

(56) References Cited

U.S. PATENT DOCUMENTS

| | | |
|---|---|---|
| 7,144,547 B2 | 12/2006 | Yamamoto |
| 2003/0209424 A1 | 11/2003 | Brandle |
| 2003/0217917 A1 | 11/2003 | Yamamoto |
| 2004/0022662 A1 | 2/2004 | Lipkin |
| 2004/0121147 A1 | 6/2004 | Morikawa et al. |
| 2004/0185182 A1 | 9/2004 | Lipkin |
| 2005/0214579 A1 | 9/2005 | Tsushima et al. |
| 2007/0000772 A1 | 1/2007 | Ramm et al. |
| 2008/0020138 A1 | 1/2008 | Ramm et al. |
| 2008/0090099 A1* | 4/2008 | Ramm ............... C23C 14/0021 428/699 |
| 2009/0269600 A1 | 10/2009 | Ramm |
| 2009/0269615 A1 | 10/2009 | Ramm |

FOREIGN PATENT DOCUMENTS

| | | |
|---|---|---|
| EP | 0 734 873 B1 | 10/1996 |
| EP | 1348776 A1 | 10/2003 |
| EP | 1391533 A1 | 2/2004 |
| EP | 1700928 A1 | 9/2006 |
| EP | 2 265 744 B1 | 12/2010 |
| ES | 2 377 225 T3 | 3/2012 |
| JP | 08-49066 A | 2/1996 |
| JP | 2000-129445 A | 5/2000 |
| JP | 2002-053946 A | 2/2002 |
| JP | 2003-286566 A | 10/2003 |
| JP | 3828181 B2 | 7/2006 |
| JP | 4155641 B2 | 9/2008 |
| JP | 4502475 B2 | 7/2010 |
| JP | 2011-518949 A | 6/2011 |
| KR | 2006-0092094 A | 8/2006 |
| MX | 2009000593 A | 4/2009 |
| MX | 2012006902 A | 10/2012 |
| RU | 2163942 C2 | 3/2001 |
| WO | 2006/099758 A2 | 9/2006 |
| WO | 2006/099760 A2 | 9/2006 |
| WO | 2006099760 A2 | 9/2006 |
| WO | 2008009619 A1 | 1/2008 |
| WO | 2009/129880 A1 | 10/2009 |

OTHER PUBLICATIONS

Ramm et al., "Thermal Stability of Thin Film Corundum-Type Solid Solutions of (Al1-xCrx)2O3 Synthesized Under Low-Temperature Non-Equilibrium Conditions", Advanced Engineering Materials Jun. 2007, 9, No. 7, pp. 604-608 (Year: 2007).*

Ramm et al., "Pulse enhanced electron emission (P3e™) arc evaporation and the synthesis of wear resistant Al—Cr—O coatings in corundum structure", Surface & Coatings Technology 202 (May 2007) 876-883 (Year: 2007).*

T. Schemmel et al, "Process for High Rate Deposition of Al2O3," Vac-Tec Systems, Inc., Mar. 16, 1989.

Figure 6:
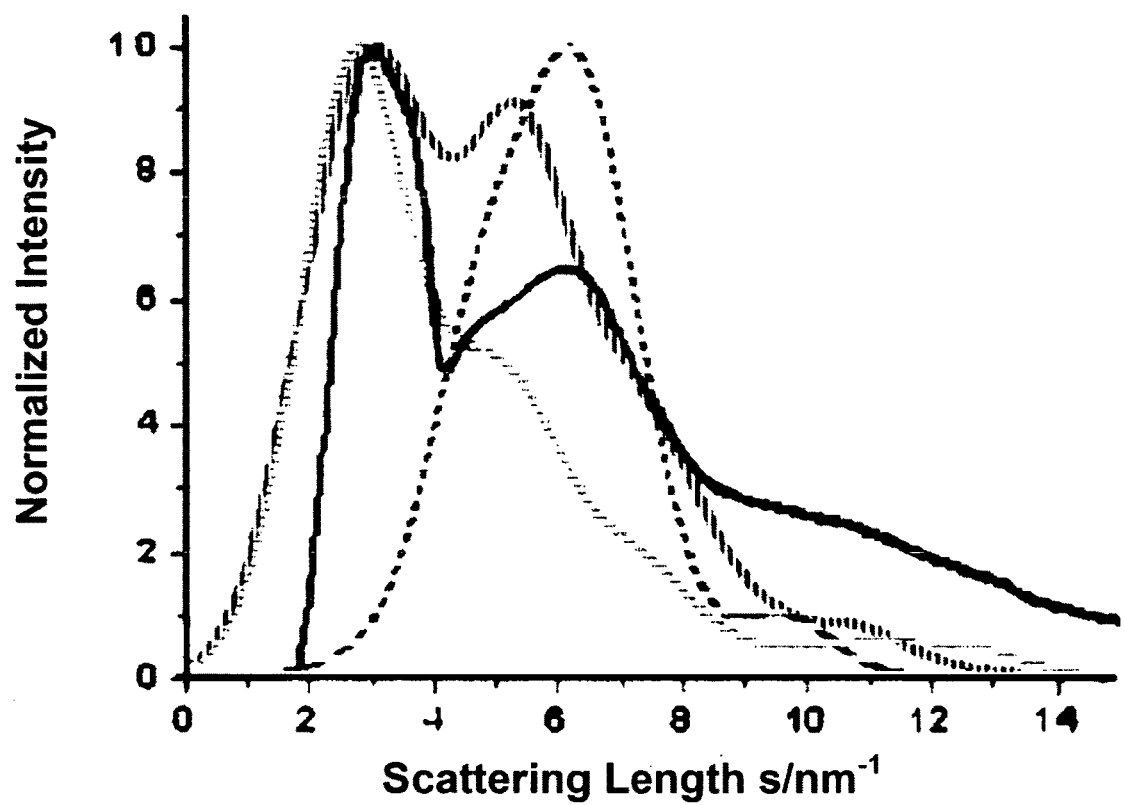

Stahr, et al., "Dependence of the Stabilization of [alpha]-Alumina on the Spray Process," Journal of Thermal Spray Technology, Dec. 2007 Springer New York LLC US, vol. 16, No. 5-6, Dec. 2007, pp. 822-830, XP002530250, figures 11, 6.

International Search Report for PCT/EP2009/000852 dated Jun. 15, 2009.

Sitte, "Investigation of the Miscibility Gap of the System Chromia" Graz, Austria, 1985, pp. 451-456.

Abstract of DE 19522331 dated Jan. 4, 1996.

Schemmel, et al., "Process for High Rate Deposition of Al2O3" Thin Solid Films, Boulder, CO., 1989, pp. 597-601.

Abstract of KR 10-2005-0102054 dated Oct. 25, 2005, corresponds to U.S. Pat. No. 7,144,547.

* cited by examiner

FIG. 2349.—System $Al_2O_3$–$Nb_2O_5$; preliminary.

G. K. Layden, *J. Am. Ceram. Soc.*, 46 [10] 506 (1963).

METHOD FOR PRODUCING METAL OXIDE LAYERS OF PREDETERMINED STRUCTURE THROUGH ARC VAPORIZATION

The invention concerns a method for producing metal oxide layers of predetermined structure through arc vaporization according to the preamble of claim 1.

In particular, the invention concerns the production, selection and operation of so-called "alloy targets", i.e. targets consisting of at least two metallic and/or semi-metallic components and that serve as vaporization sources in cathodic arc vaporization.

The invention is of particular importance for "alloy targets" composed of metals with very different melting temperatures.

These alloy targets are defined as having at least two metallic components but that can also exist as inter-metallic compound and/or mixed crystals.

A powder-metallurgical target in this case is a target that is produced from powders of metals, semi-metals, inter-metallic compounds, mixed crystals and where, after the production process (for example in a hot isostatic pressing (HIP) process), the powder particles in the microscope resolution can still be distinguished. A powder-metallurgical alloy target can thus be produced from a mixture of metal and/or semi-metal powders, from a powder of an inter-metallic compound or a mixture of metal and/or semi-metal powders and/or inter-metallic compounds. In contrast thereto, a cast-bonded metallurgical alloy target is a target where the primary metals resp. semi-metals form an inter-metallic phase. Characteristic for this is that the particles of the primary material can no longer be seen in the microscope resolution, i.e. they are no longer present.

In addition, there are so-called plasma-arc sprayed targets. These are targets that have been produced through plasma-arc spraying. A partial or complete formation of inter-metallic components of the primary materials can occur in these targets. Generally, however, the plasma-arc sprayed target can contain both particles as well as inter-metallic phases.

Cathodic arc vaporization is a method established for years that finds application in the coating of tools and components and with which a wide range of metallic layers as well as metal nitrides and metal carbon nitrides are deposited. For all these applications, the targets are the cathode of a spark discharge, operated at low tensions and high currents and with which the target (cathode) material is vaporized. Direct-current voltage supply is used as easiest and most economical power supply for operating the spark discharges.

More problematic is the production of metal oxides by means of arc vaporization. It is difficult to operate a direct-current spark discharge in oxygen resp. in an oxygen-containing atmosphere, in order to deposit oxidic layers for example on tools or components. There is then a risk that both electrodes of the direct-current discharges (on the one hand, the target as cathode as well as, on the other hand, the anode, that is often operated on earth potential) become coated with insulating layers. This leads, on the target (cathode), depending on the source design (magnetic field, location and type of gas inlet), to the electrically conductive zone onto which the spark runs constricting itself and finally to an interruption of the spark discharge.

T. D. Schemmel, R. L. Cunningham and H. Randhawa, Thin Solid Films 181 (1989) 597, describes a high rate coating process for $Al_2O_3$. The oxygen gas inlet was introduced in the substrate's vicinity after filtering of the spark. It is mentioned that the oxygen inlet after the filter in the vicinity of the substrate is important to reduce the target's oxidation and stabilize the spark discharge.

The production of oxidic layers is also described in U.S. Pat. No. 5,518,597. The patent comprises the layer deposition at increased temperatures and is based on the fact that the anode is also heated (800° C.-1200° C.) and the reactive gas is not introduced directly at the target. The high anode temperature keeps the anode conductive and enables a stable operation of the spark discharge.

In US2007/0,000,772A1, WO2006/099,760A2 and WO2008/009,619A1, the operation of a spark discharge in oxygen atmosphere is described in detail and the method is suggested with which a complete coating with an insulation layer impenetrable for a direct current (DC) on the cathode can be avoided.

US2007/0,000,772A1 and WO2006/099,760A2 describe primarily the operation of the spark source with pulsed current as an essential factor for keeping the cathode surface free from impenetrable oxide layers and ensure a stable spark discharge. Through the pulsing of the spark current, for which a special power supply is necessary, the spark is continually directed onto new paths over the target and prevented from moving only in preferred zones and the remaining target areas becoming coated with thick oxide (as is the case with "steered arc").

In WO2008/009,619A1, the operation of the spark discharge in oxygen atmosphere is described, wherein the cathode is provided with a preferably small magnetic field perpendicular to the target surface. This allows a regular spark course over the target surface and thus prevents a thick oxidation build-up of the target impenetrable for the direct current.

On the basis of these three prior art documents, it is possible to ensure a stable spark discharge over several hours in pure oxygen atmosphere. These methods work in a stable and reproducible manner for elementary targets and for bonded-cast produced targets.

Characteristic for the layers produced by means of arc vaporization are the droplets of metal that are not completely oxidized through and that form difficult to avoid metallic conglomerates in the layer. In the case of alloy targets, these droplets form mainly from the higher-melting metal or from an alloy corresponding essentially to the composition of the target. There are elaborate technical measures for avoiding such droplets, for example through filtering. This means not all layers produced by arc vaporization have droplets. All layers that have droplets were however produced through arc vaporization. The increasing use of arc vaporization for producing the most varied metal oxides requires a flexible and cost-effective target production. Many targets are produced in a method best known to the one skilled in the art by means of hot isostatic pressing (HIP). In case for example an Al—Cr target is to be made, a powder or powder mixture of the desired composition from the elements (here for example and in non-limiting way: Al and Cr) is sealed in a container that is subjected in vacuum to high temperatures in order to reduce air and humidity in the powder. The container is then sealed and subjected to high pressure at high temperature. This method reduces the inner voids and achieves a certain bonding of the powder. The resulting material has a uniform distribution as regards particle size and nearly 100% density.

It is an aim of the invention to propose a method for producing metal oxide layers through arc vaporization with which metal oxide layers of a predetermined crystal structure can be deposited reliably and with which the formation temperature of the metal oxides that are deposited onto the substrate can be set as wished.

The aim is achieved with a method having the characteristics of claim 1.

Advantageous further developments are indicated in the subclaims dependent from it.

A further aim is to propose a target for the production of metal oxide layers with which metal oxide layers of a predetermined crystal structure can be deposited reliably and with which the formation temperature of the metal oxides that are deposited onto the substrate can be set as wished.

The aim is achieved with a target having the characteristics of claim 7.

Advantageous further developments are indicated in the subclaims dependent from it.

A further aim is to propose metal oxide layers that can be deposited cost-effectively and reliably with any desired composition.

The aim is achieved with a metal oxide layers having the characteristics of claim 10.

Advantageous further developments are indicated in the subclaims dependent from it.

It has been observed that the metal oxide layers synthesized onto the substrate by means of arc vaporization when using alloy targets essentially have a composition as regards the metallic parts that, unsurprisingly, corresponds to the composition of the alloy target. Unexpectedly, however, the crystal structure of the deposited layers also lets itself be influenced strongly and controllably through the composition of the alloy target. This was particularly startling for powder-metallurgical targets, since in those cases still separate particles of the alloy materials are present in the target. An influence of the crystal structure and/or of the phase composition of the synthesized metal oxide layer on the substrate depending on the target alloy composition could furthermore be observed. An explanation therefore would be that a synthesis of the materials forming the metal oxide layers by means of arc vaporization takes place for an essential part already on the target surface, which is completely in contradiction to the usual beliefs about the production of physical vapor deposition (PVD) layers, which rather assumes a synthesis of the materials on the substrate.

According to the invention, it is possible by using the phase diagrams to set the formation temperature for the oxide that is synthesized during arc vaporization through the composition of the arc target, though it is in principle irrelevant whether the target is powder-metallurgical (with small particle size of less than 300 μm) or was produced in another way (bonded-cast, by forging or through plasma-arc spraying).

As a rule, phase diagrams are obtained in that a mixture of liquids emerging from a high temperature is cooled and the formation of the different phases and of the phase transitions is measured.

In contrast thereto, the process of arc vaporization is a process through which solid material is converted into the vapor phase, with typical spark life spans being less than one μs or even lying in the nm range and the diameter of a spark crater being in the μm or even only in the nm range. Arc vaporization is also a very short process and the spark finds space on a surface that is small as compared with the particle sizes in a powder-metallurgical produced target. Therefore, the notion of drawing on the phase diagrams as an aid for forming metal oxide layers by means of arc vaporization is rather strange. According to the present invention, it has however been shown that the formation temperature of the oxides during arc vaporization can be determined on the basis of the transition, that can be read in the phase diagram, from the completely liquid phase into a phase comprising solid component elements. On the basis of this recipe it is possible to specifically select the formation temperature of oxides. Since the formation temperature of the oxides exerts a considerably influence for instance on the crystal structure of the layers to be formed with these oxides, a specific synthesis of desired crystal structure by means of arc vaporization is hereby possible. Why this transition from the liquid phase determines this formation temperature, the inventor was unable to explain so far.

In the explanations, reference will be made to alloy targets consisting of two metallic or semi-metallic components, although all that is said also applies by analogy also to targets with more than two components ("higher alloys"), regardless of the production method.

Figure 1:
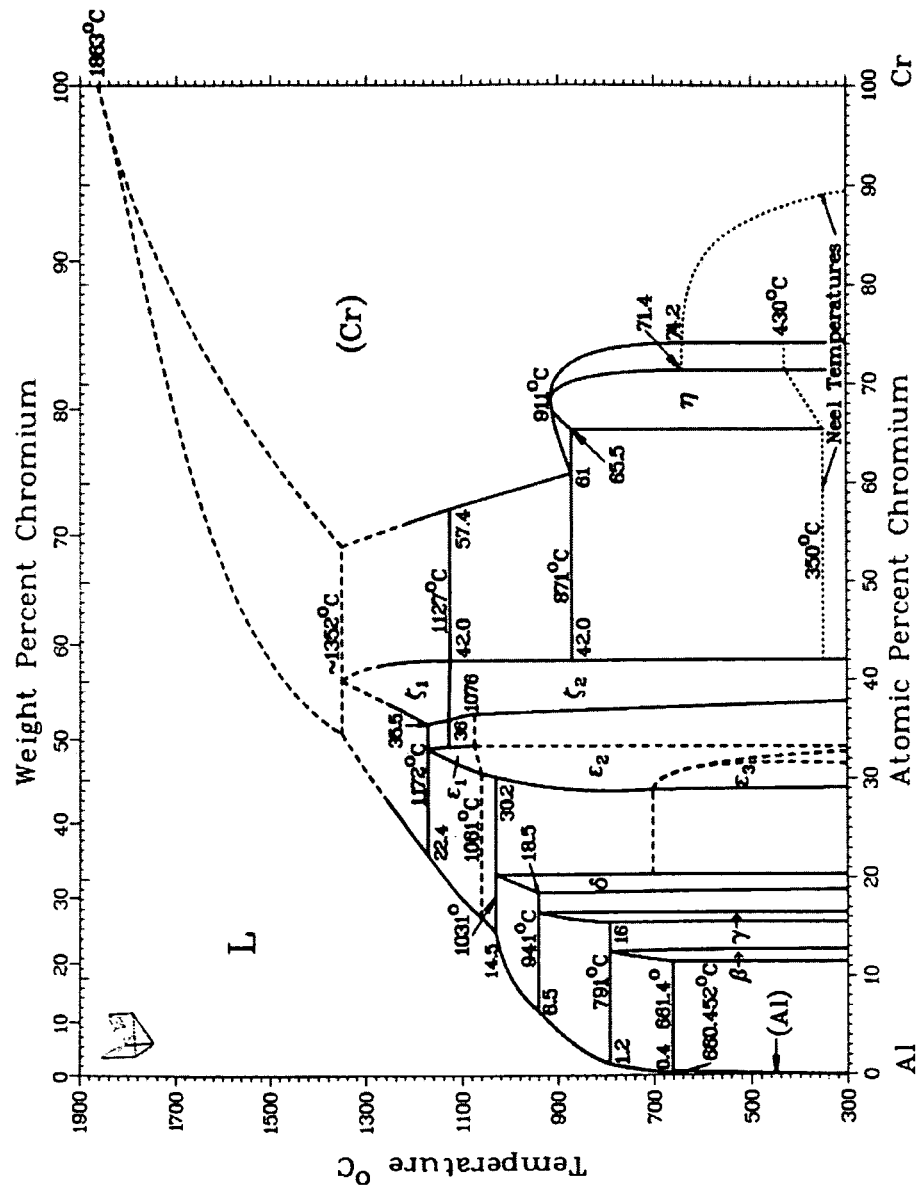
Figure 2:
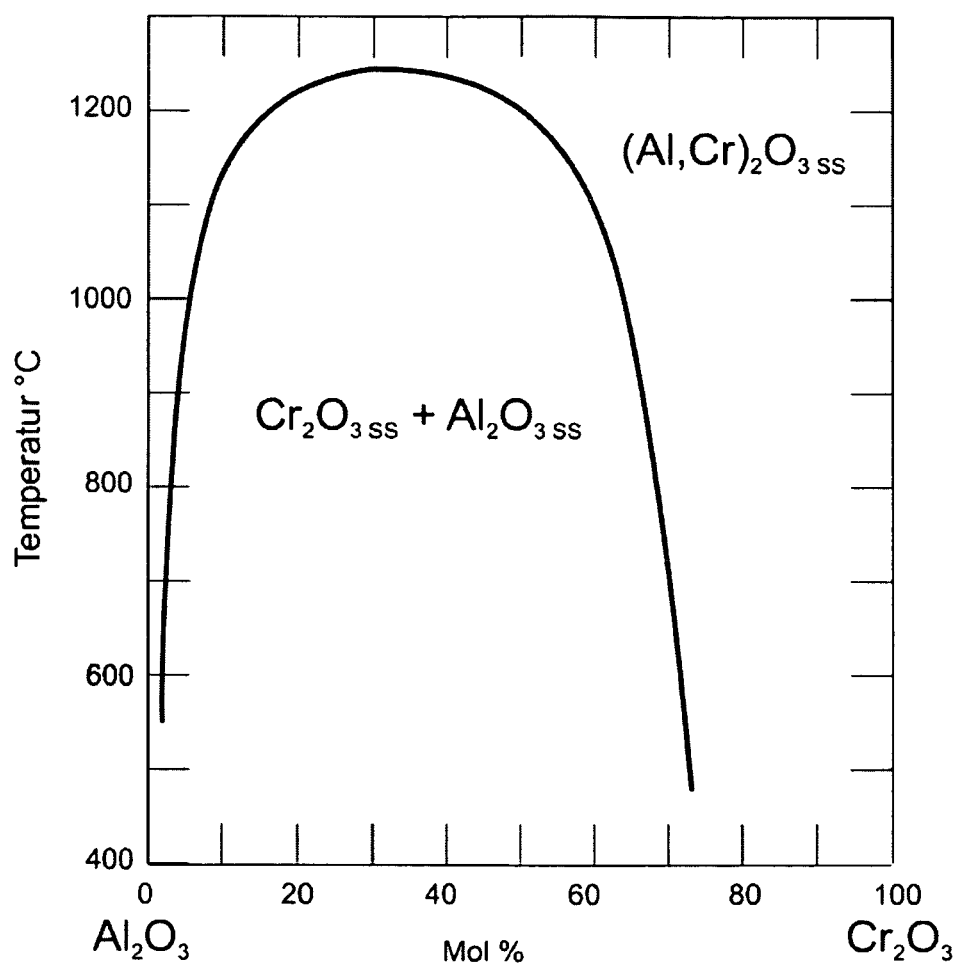
Figure 3:
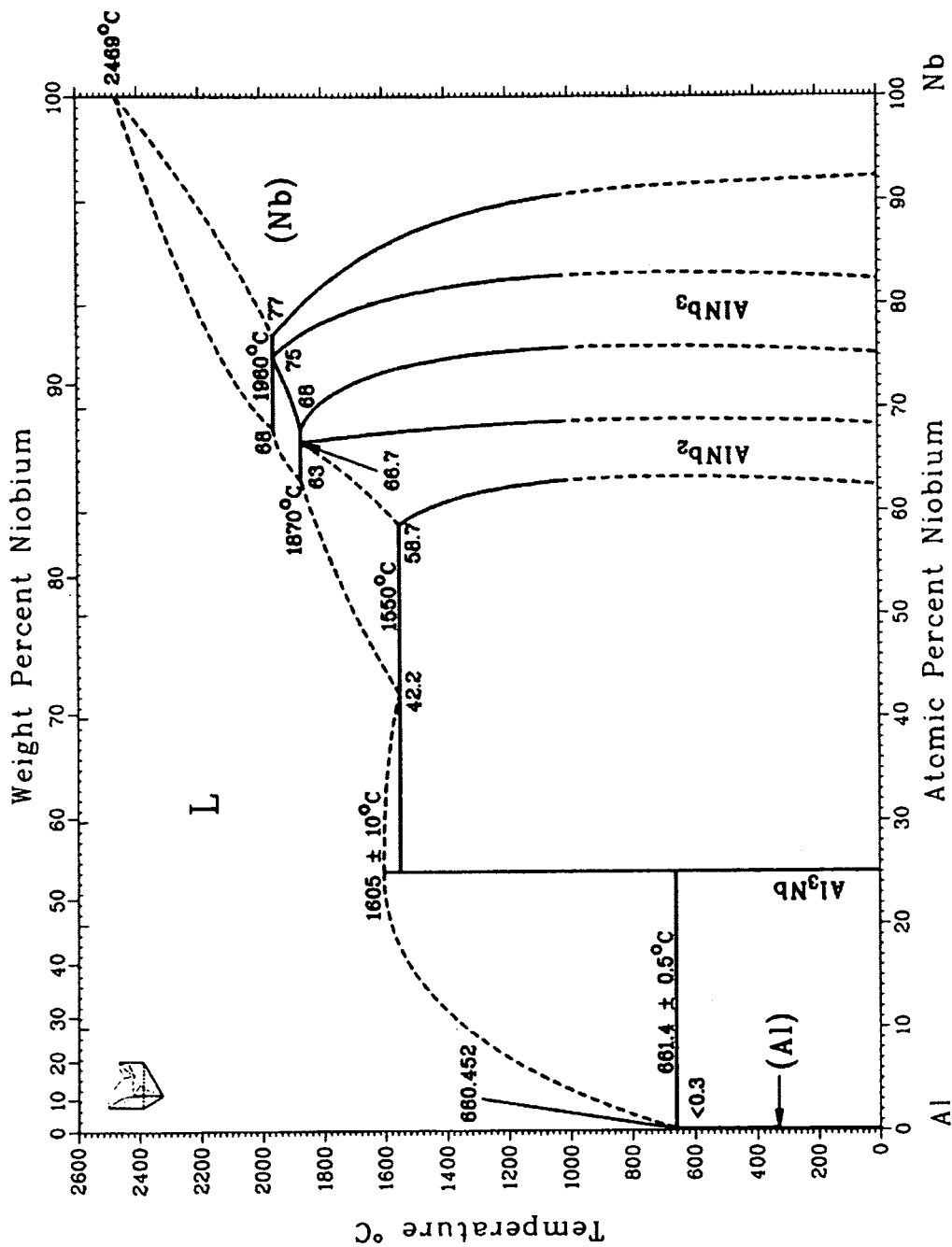
Figure 4:
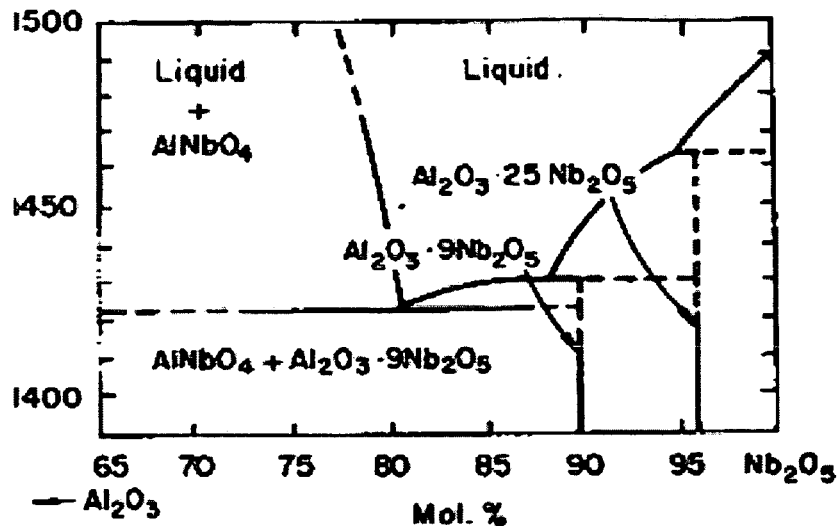
Figure 5:
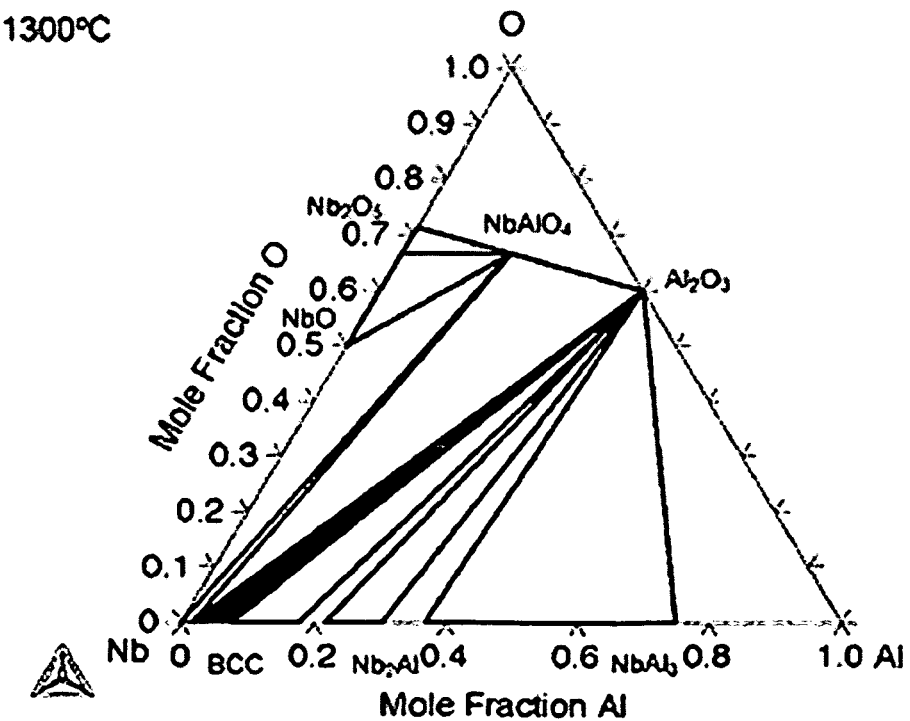

The invention will be explained by way of example on the basis of drawings, which show:

FIG. 1: the binary phase diagram of Al—Cr;
FIG. 2: the ternary phase diagram of Al—Cr—O;
FIG. 3: the binary phase diagram of Al—Nb;
FIG. 4: part of a ternary phase diagram of Al—Nb—O;
FIG. 5: part of a modified ternary phase diagram of Al—Nb—O according to Misra;
FIG. 6: the result of an analysis by means of electron diffraction on an Al—Nb—O layer.

According to the invention, the structure of the oxide to be deposited can be read on the basis of the phase diagram of the metallic or semi-metallic components from which the oxide is synthesized. This means for example that for a ternary Al—Cr—O, the binary phase diagram of Al—Cr is consulted. For a quaternary oxide, the ternary phase diagram of the oxide forming metals or semi-metals is accordingly consulted. The target for arc vaporization is then formed from the metals or semi-metals from which the oxide of corresponding structure is to be formed. The target composition is selected in such a way that the temperature at the transition to the liquid phase according to the phase diagram fulfills the conditions for the formation temperature of the oxide of the desired structure. The oxide formation is then achieved by the reaction of the vaporized target, or target to be vaporized, with the oxygen.

This means that in order to generate a certain desired structure, if necessary, alloy targets are specifically produced which according to the phase diagram promise the deposition of the main element of the alloy target as oxide in the corresponding structure, for example with Al as main element in the $Al_2O_3$ in corundum structure.

The result achieved by the oxide synthesis will depend on the involved metallic or semi-metallic components that constitute the alloy target. In the case of an Al—Cr target, one arrives through large concentration areas to a mixed crystal formation, as evidenced by a comparison of the binary phase diagram of the Al—Cr material system (see FIG. 1) with the phase diagram of the ternary Al—Cr—O, as represented in FIG. 2 and which is to be explained here in more detail.

The comparison between FIG. 2 and FIG. 3 shows that for targets with less than 75 at % Al, the temperature for the transition into the liquid phase (FIG. 1) always lies above the temperature for the mixed crystal formation with the corresponding target composition. From this, the inventor concluded that for targets with less than 75 at % Al, the formation temperature (transition into the liquid phase) for the oxide always lies above the temperature that is necessary for producing Al—Cr—O mixed crystals (range above the curve in FIG. 2).

For 90 at % Al, this is however for example no longer the case. For this concentration, the transition into the liquid phase occurs at less than 1000° C., as shown by the binary phase diagram (FIG. 1). From FIG. 2, however, it emerges that with this alloy ratio, a mixed crystal will be present only above 1100° C. Therefore, during arc vaporization from an alloy target consisting of 90 at % Al and 10 at % Cr, a layer is synthesized that does not form any mixed crystal, but that consists of separate phases of Al—O and Cr—O. However, the temperature during the transition into the liquid phase (FIG. 1) determines the crystal structure also for these separate phases, as the inventor discovered to his surprise. But, since the formation of aluminum oxide in corundum phase will require more than 1000° C., such a target composition will also not generate any corundum phase formation of the aluminum oxide.

At less than 90 at % Al, according to FIG. 1, a transition into the liquid phase will occur only above 1000° C. As long as the proportion of Al in the target is however kept above 75 at %, no mixed crystal formation can be achieved, as described above. It is thus possible to produce aluminum oxide in corundum structure without parasitic mixed crystal formation by using alloy targets for arc vaporization that have an aluminum content between 75 at % and less than 90 at % Al.

In contrast to US2008/0,090,099 wherein the production of mixed crystals with $Al_2O_3$ in corundum structure on the basis of alloy targets with Al/Cr composition of 30/70 or less aluminum content is discussed, in the present example it is thus precisely the formation of mixed crystals that is efficiently avoided.

In table 1 of US2008/0,090,099, an alloy target Al/Cr with a composition 90/10 is mentioned and the corresponding lattice constants of the corundum structure are indicated. In this respect it must be observed that these are not experimental values but interpolated values. As discussed above in detail, this concentration does not lead exactly to $Al_2O_3$ in corundum structure or to a formation of the mixed crystal. US2008/0,090,099 thus leads downright in the wrong direction, i.e. away from the present invention.

Concretely, one can for example, according to the present invention, use an 80 at % Al alloy proportion in the target. With this alloy ratio, the transition into the liquid phase occurs at about 1100° C. In order however to produce a mixed crystal oxide, temperatures of no less than 1200° C. are necessary with such an alloy ratio (see FIG. 2). As a consequence, the oxides of the alloys are synthesized not as mixed crystal but separately, yet the aluminum oxide generated in this process is formed at 1100° C. and accordingly is present in the thermodynamically stable corundum phase.

This is in opposition to what is claimed in claim 6 of US2008/0,090,099 which proclaims a mixed crystal formation at, among others, 80% aluminum content.

The proof of the crystal structure, as known to the one skilled in the art, can be carried out by means of X-ray diffraction. In some cases, especially at the often desired low substrate temperatures, the crystallit sizes are however too small for X-ray diffraction. In the present case, an analysis was performed by means of electron diffraction and with these means the corundum structure was demonstrated without doubt for crystallits of about 10 nm size.

Yet another example is to be mentioned, wherein, regarding the metallic or semi-metallic components, no freely miscible oxide (mixed crystal formation) will however result during layer synthesis, as is the case in the Al—Cr—O system, and wherein especially phase mixtures of the oxides are formed. For this, the Al—Nb material system was chosen, whose binary phase diagram is represented in FIG. 3. Here too it was shown that the composition of the target as regards its metallic and semi-metallic component determines the transition temperature out of the liquid phase and thus, according to the inventor's idea, defines the formation temperature of the metal oxide.

According to the invention and following the recipe, it again depends on the involved metallic or semi-metallic components constituting the alloy target as to which result the synthesis of the oxide will lead. In the case of the Al target, to which 10 at % Nb is admixed, the formation temperature of the synthesized metal oxide onto the substrate is modified from approx. 680° C. (elementary Al target) to approx. 1300° C. (alloy with 10 at % Nb, FIG. 3). For this temperature, the phase diagram of the ternary Al—Nb—O of Misra (FIG. 5) provides a phase mixture that, besides $Nb_2O_5$ and $NbAlO_4$, also comprises $Al_2O_3$. Since this $Al_2O_3$ according to the invention is formed at 1300° C., it is present in corundum structure, which can be demonstrated through electron diffraction.

Whilst the phase diagrams for the binary systems have mostly been well investigated, it can happen that the phase diagrams of the corresponding ternary oxides have not been investigated for all temperature ranges and that these are therefore not available as in the case of the Al—Cr—O material system. Also, the phase diagrams of the ternary oxides are mostly more complicated than the phase diagram for Al—Cr—O, which essentially comprises an area of mixed crystal formation and separate binary oxide phases. The phase diagrams from neighboring temperature ranges can however then be drawn upon for an estimation.

In the case of Al—Nb—O, the inventor could for example, with a target composition of 80 at % Al and 20 at % Nb, estimate from the binary phase diagram as represented in FIG. 3 an oxide formation temperature of about 1600° C., yet could not find a phase diagram of the ternary system at this temperature.

FIG. 4 (Layden) now represents the temperature range up to 1500° C. for the ternary system. The modified phase diagram of Misra for the ternary system from the year 2005 (FIG. 5) for the same material system was also measured only for 1300° C.

As already explained, increasing the Nb content in the alloy target leads, according to FIG. 3, to an increase of the metal oxide formation temperature to approx. 1600° C. On the basis of both available diagrams for the ternary system (FIGS. 4 and 5), it can however be conjectured that at 1600° C., no doubt in particular a formation of $AlNbO_4$ with possible parts of $Nb_2O_5$ and with at least 60 mol % of aluminum oxide would occur. Since the oxide formation temperature is about 1600° C., all aluminum oxide essentially has the high temperature phase, i.e. is present in the corundum structure. Again, electron diffraction on the layers thus synthesized was performed. In FIG. 6, the measured intensity distribution of the electron diffraction diagram is represented with continuous bold lines. The location of the intensity peaks for $AlNbO_4$ (vertically dashed bold line with two pronounced peaks), $Nb_2O_5$ (horizontally dashed line with only one maximum being at approx 2.4 nm) and $Al_2O_3$ in corundum structure (dashed line with maximum at a scattering length of approx. 6 nm) are by contrast simulated curves. One has refrained from also simulating the intensities mathematically, since this would have been linked with too many assumptions. The location of the intensity peaks however clearly shows that the synthesized layer consists essentially of a mixture of $AlNbO_4$ and aluminum oxide in corundum structure, which can be recognized in that the position of the two local intensity maxima in the measured curve appear for those scatter lengths for which the intensity maxima of the simulated (computed) curves for $AlNbO_4$ and $Al_2O_3$ (corundum) are also located. In contrast, the intensity maxima of the computed $Nb_2O_5$ relative to the scatter lengths is somewhat shifted, although of course it cannot be excluded, however, that also parts of $Nb_2O_5$ are also contained in the synthesized layer.

The possibility of determining the formation temperature of the oxide during layer synthesis and the results of the electron diffraction thus lead to the surprising possibility of designing, using the above represented recipe, a method with which high temperature oxides of low-melting materials can be produced. In other words: with this method, the melting point of a low-melting material can be increased so much that the necessary temperatures for forming a specific oxide phase are reached that otherwise could not be achieved during arc vaporization, because the melting point of the low-melting metal lies way below the formation temperature of the high temperature oxide.

Although all this applies in general, we will go again in particular and without limitation into the details of the important example of the production of aluminum oxide in corundum structure, which is not readily possible through arc vaporization of an elementary aluminum target, since the melting point of aluminum at 660° C. is way below the formation temperature of corundum (approx. 1000° C.). On the basis of the explanations so far, the procedure is as follows.

In order to raise the formation temperature of the aluminum oxide to about 1000° C., a suitable higher-melting material is sought and used to produce an alloy target (without limitation in the production process), the percentage content of the higher-melting material component being adjusted in such a way that according to the binary phase diagram, at least an oxide formation temperature of 1000° C. is achieved. In the process, already very small admixtures to the target can lead to such an increase of the oxide formation temperature. In the case of Nb (FIG. 3), about 3 at % are sufficient. Again, the layers produced in this manner were investigated by means of electron diffraction and the corundum phase of the aluminum oxide could be demonstrated.

The invention also makes it possible to further influence essentially the layer to be synthesized. This means influencing the crystallite size of 10 nm to 500 nm through the formation temperature of the metal oxide. PVD processes are, among others, characterized in that the layer deposition occurs mostly away from the thermal equilibrium, i.e. at lower substrate temperatures. The vaporized material is thus quickly cooled when deposited onto the substrate. This fast cooling has the consequence that only small crystallites can be formed in the layer. This is partly desired, in order to produce amorphous layer structures. In some cases, however, larger crystallites are advantageous. According to the state of the art, in PVD processes either the substrate temperature will then be increased through heating or it will be attempted to introduce additional energy through ion bombardment into the growing layer. On the basis of the present invention, however, the composition of the alloy target can be modified in such a way that higher formation temperatures of the metal oxide layers are achieved, i.e. for example the $Al_2O_3$ is formed not at 1100° C. but at 1300° C. Through the increased oxide formation temperature, the energy input into the layer is then also increased, which leads to larger crystals. The recipe here again supplies the course of action.

Of course, these considerations, as already mentioned above, apply not only for binary alloys but also for ternary, quaternary and higher alloys on the basis of which one wishes to synthesize oxide layers.

Finally, it is to be mentioned that the inventive recipe can be reversed and that it is thus in a certain sense even possible to synthesize layers whose analysis can contribute to establishing phase diagrams. This means a method for establishing phase diagrams has hereby been disclosed.

The insights about producing high temperature oxides through the target composition according to the phase diagrams apply not only for reactive cathodic arc vaporization but also for reactive sputter and reactive pulsed sputter (high power and modulated pulsing), though the process management then is not as uncomplicated as in the case of cathodic arc vaporization (oxygen control).

The invention claimed is:

1. Method for depositing layers on a substrate, by means of arc vaporization of at least one target formed of an alloy in the presence of oxygen, wherein the layers comprise a ternary and/or higher oxide of metallic and/or semi-metallic components including Nb, characterized in that a formation temperature of the oxide that is synthesized during arc vaporization is based on a composition of the at least one target formed of an alloy, the method comprising steps of:
   selecting the composition of the at least one target so that a temperature at a transition of the alloy to a liquid phase according to a phase diagram corresponds with the formation temperature of the oxide,
   selecting the composition of the at least one target so that according to the phase diagram the composition of the at least one target results in a deposition of a main element of the at least one target as oxide in a corresponding structure, wherein the main element of the at least one target is aluminum and the corresponding structure is $Al_2O_3$ in corundum structure,
   wherein the alloy forming the at least one target consists of aluminum and the further metallic or semi-metallic components including Nb, wherein the alloy according to the phase diagram transitions to the liquid phase above 1000° C.,
   wherein the oxide formation is achieved by the reaction of the at least one target with oxygen, and
   wherein oxides of the alloy of the target are synthesized separately to avoid formation of mixed crystals, and
   depositing the layers on the substrate.

2. Method according to claim 1, characterized in that the layers have a proportion of more than 70 at % aluminum oxide in corundum structure by using at least one aluminum target produced by powder-metallurgy or cast-bonding and admixing smaller than 20 at % ratio of one or several metallic or semi-metallic components, characterized in that the admixtures have higher melting temperatures and thus, a melting temperature of the mixture of at least 1000° C. according to the phase diagram is achieved.

3. Method according to claim 1, wherein the at least one further metallic or semi-metallic component is only Nb.

4. The method according to claim 1, wherein the Nb in the at least one target is 10 at % and the oxide formation temperature of $Al_2O_3$ is 1300° C.

5. The method according to claim 1, wherein the Nb in the at least one target is 20 at % and the oxide formation temperature of the $Al_2O_3$ is 1600° C.

6. The method according to claim 1, wherein the metallic or semi-metallic element includes Au.

7. The method according to claim 1, wherein the metallic or semi-metallic element includes B.

8. The method according to claim 1, wherein the metallic or semi-metallic element includes C.

9. The method according to claim 1, wherein the metallic or semi-metallic element includes Fe.

10. The method according to claim 1, wherein the metallic or semi-metallic element includes Hf.

11. The method according to claim 1, wherein the metallic or semi-metallic element includes Ir.

* * * * *